(12) United States Patent
Pai et al.

(10) Patent No.: US 9,269,760 B2
(45) Date of Patent: *Feb. 23, 2016

(54) METHOD OF FABRICATING SEMICONDUCTOR DEVICE

(71) Applicant: TAIWAN SEMICONDUCTOR MANUFACTURING COMPANY, LTD., Hsinchu (TW)

(72) Inventors: Chih-Yang Pai, Hsinchu (TW); Kuo-Chi Tu, Hsinchu (TW); Wen-Chuan Chiang, Hsinchu (TW); Chung-Yen Chou, New Taipei (TW)

(73) Assignee: Taiwan Semiconductor Manufacturing Company, Ltd., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,248

(22) Filed: Jan. 27, 2015

(65) Prior Publication Data

US 2015/0140774 A1    May 21, 2015

Related U.S. Application Data

(60) Continuation of application No. 14/291,069, filed on May 30, 2014, now Pat. No. 8,969,937, which is a continuation of application No. 14/149,945, filed on Jan. 8, 2014, now Pat. No. 8,759,193, which is a division of application No. 13/462,427, filed on May 2, 2012, now Pat. No. 8,643,074.

(51) Int. Cl.
*H01L 27/108*   (2006.01)
*H01L 49/02*    (2006.01)
(Continued)

(52) U.S. Cl.
CPC .......... *H01L 28/40* (2013.01); *H01L 21/76879* (2013.01); *H01L 23/5223* (2013.01);
(Continued)

(58) Field of Classification Search
CPC .............. H01L 21/02296; H01L 21/70; H01L 27/10847
See application file for complete search history.

(56) References Cited

U.S. PATENT DOCUMENTS

| 8,643,074 B2 | 2/2014 | Pai et al. | |
|---|---|---|---|
| 8,759,193 B2 * | 6/2014 | Pai et al. | ............ 438/386 |
| 2003/0215997 A1 | 11/2003 | Hachisuka et al. | |

(Continued)

FOREIGN PATENT DOCUMENTS

| CN | 101740572 | 6/2010 |
|---|---|---|
| CN | 101859727 | 10/2010 |

(Continued)

OTHER PUBLICATIONS

Office Action with English translation dated Sep. 26, 2013 from corresponding application No. KR 10-2012-0083943.

*Primary Examiner* — Cheung Lee
(74) *Attorney, Agent, or Firm* — Haynes and Boone, LLP

(57) ABSTRACT

A method of fabricating a semiconductor device comprises forming a first etch stop layer over a first dielectric layer. The method also comprises forming a first trench in the first etch stop layer and the first dielectric layer. The method further comprises filling the first trench with a conductive material. The method additionally comprises forming a second etch stop layer over the first etch stop layer. The method also comprises forming a second dielectric layer over the second etch stop layer. The method further comprises forming a second trench to expose the conductive material. The second trench is formed having a depth less than a total thickness of the first etch stop layer, the second etch stop layer and the second dielectric layer. The method additionally comprises depositing a first metal layer over sidewalls of the second trench and in contact with the conductive material.

20 Claims, 7 Drawing Sheets

(51) Int. Cl.
*H01L 23/522* (2006.01)
*H01L 23/532* (2006.01)
*H01L 21/768* (2006.01)

(52) U.S. Cl.
CPC ...... *H01L23/5226* (2013.01); *H01L 23/53295* (2013.01); *H01L 27/108* (2013.01); *H01L 27/1085* (2013.01); *H01L 27/10894* (2013.01); *H01L 28/90* (2013.01); *H01L 21/76832* (2013.01); *H01L 2924/0002* (2013.01)

(56) References Cited

U.S. PATENT DOCUMENTS

2010/0213572 A1  8/2010  Ching et al.
2012/0025347 A1  2/2012  Choi

FOREIGN PATENT DOCUMENTS

KR    10-2010-0097010    9/2010
KR    10-1100765         1/2012

\* cited by examiner

METHOD OF FABRICATING SEMICONDUCTOR DEVICE

PRIORITY CLAIM

The present application is a continuation of U.S. application Ser. No. 14/291,069, filed May 30, 2014, which is a continuation of U.S. application Ser. No. 14/149,945, filed Jan. 8, 2014, which issued as U.S. Pat. No. 8,759,193 on Jun. 24, 2014, which is a divisional of U.S. application Ser. No. 13/462,427, filed May 2, 2012, which issued as U.S. Pat. No. 8,643,074 on Feb. 4, 2014, both of which are incorporated herein by reference in their entireties.

BACKGROUND

The present disclosure is related generally to the fabrication of semiconductor devices, and, more particularly, to a metal-insulator-metal (MIM) structure, a method of manufacturing the structure, and a semiconductor device incorporating the structure.

Capacitors are components for many data manipulation and data storage applications. In general, capacitors include two conductive electrodes on opposing sides of a dielectric or other insulating layer, and they may be categorized based on the materials employed to form the electrodes. For example, in a metal-insulator-metal (MIM) capacitor, the electrodes are substantially metal. MIM capacitors offer the advantage of a relatively constant value of capacitance over a relatively wide range of voltages applied thereto. MIM capacitors also exhibit a relatively small parasitic resistance.

Generally, to minimize the size of MIM capacitors cup-shaped capacitor structures, located in capacitor openings, are used. The capacitor opening is etched through a stop layer to expose a contact plug thereunder, and over-etching is performed to ensure the capacitor opening is fully defined in every cell areas over a semiconductor wafer. When there is an overlay shift of the capacitor opening, the over-etching produces a micro-trench under the capacitor opening which may adversely affect reliability.

BRIEF DESCRIPTION OF THE DRAWINGS

Several embodiments of the present disclosure are best understood from the following detailed description when read with reference to the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
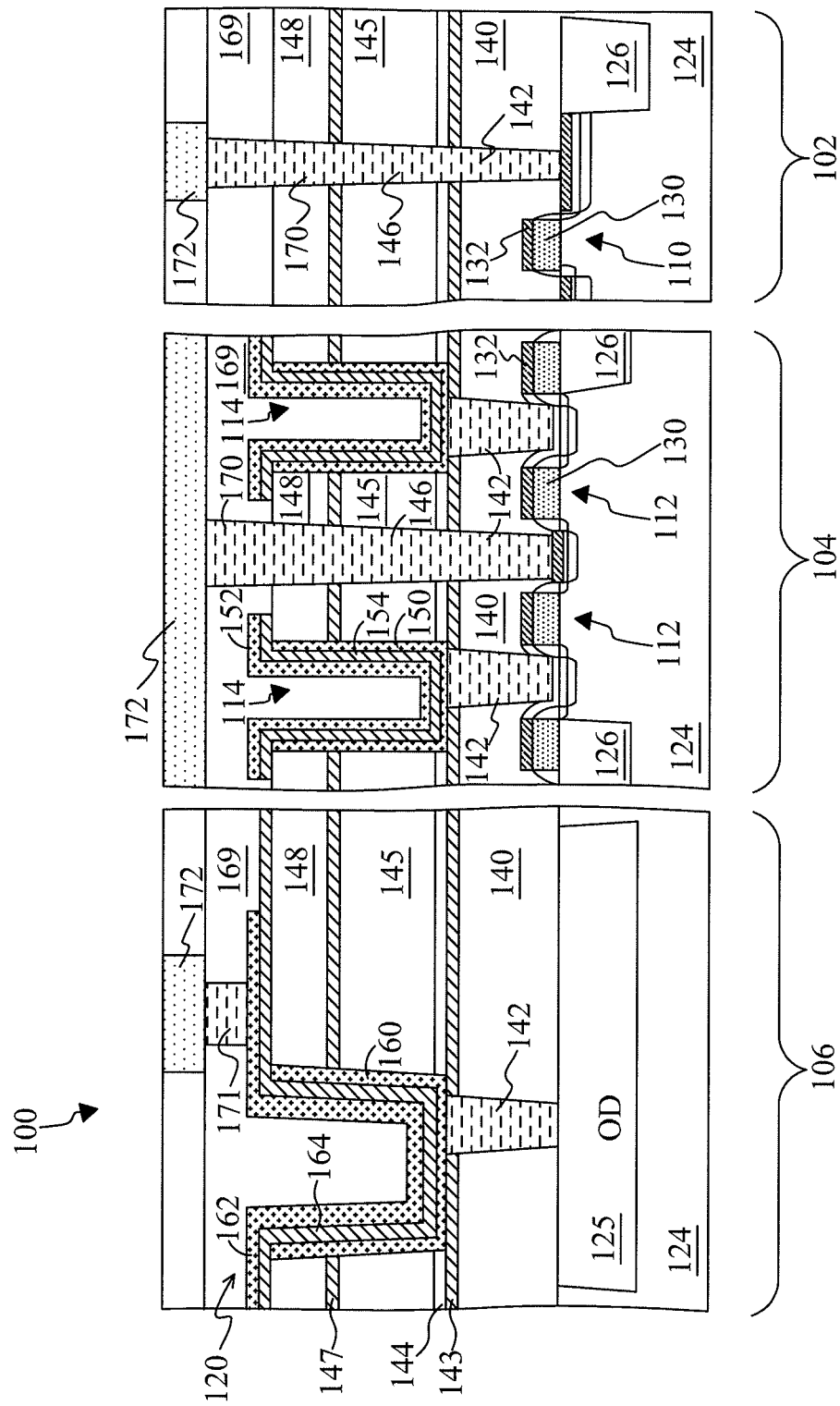
FIG. 1 is a diagrammatic sectional side view of a semiconductor device in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

FIG. 1 is a diagrammatic sectional side view of a semiconductor device 100. The semiconductor device 100 is configured as a system-on-chip (SoC) device that integrates various functions on a single chip. In one or more embodiments, the semiconductor device 100 includes regions 102, 104, 106 that are each configured for a different function. The region 102 may include a transistor 110, such as a metal oxide semiconductor field effect transistor (MOSFET) or a complementary MOS (CMOS) transistor. In one or more embodiments, the transistor 110 forms part of a logic circuit, but in other embodiments is may be part of a static random access memory (SRAM) circuit, processor circuit, or other suitable circuit. A region 104 may include a plurality of transistors 112 and capacitors 114 that, in one or more embodiments, form a dynamic random access memory (DRAM) array for memory storage. A region 106 includes a metal-insulator-metal (MIM) capacitor 120. In one or more embodiments, the MIM capacitor 120 is a decoupling capacitor but it other embodiments it may be used for various functions such as high-frequency noise filtering in mixed-signal applications. It may also be used in memory applications, oscillators, phase-shift networks, bypass filters, and as a coupling capacitor in radio frequency (RF) applications. It is understood that the semiconductor device 100 may include other features and structures such as eFuses, inductors, passivation layers, bonding pads, and packaging, but is simplified in FIG. 1 for the sake of simplicity and clarity.

The semiconductor device 100 includes a semiconductor substrate 124. In one or more embodiments, the substrate 124 includes a silicon substrate (e.g., wafer) in a crystalline structure. The substrate 124 may include various doping configurations depending on design requirements as is known in the art (e.g., p-type substrate or n-type substrate). Additionally, the substrate 124 may include various doped regions such as p-type wells (p-wells or PW) or n-type wells (n-wells or NW). Such a doped region defines an oxide definition (OD) region 125 in the region 106. The substrate 124 may also include other elementary semiconductors such as germanium and diamond. Alternatively, the substrate 124 may include a compound semiconductor such as silicon carbide, gallium arsenide, indium arsenide, or indium phosphide. Further, the substrate 124 may optionally include an epitaxial layer (epi-layer), may be strained for performance enhancement, and may include a silicon-on-insulator (SOI) structure.

The semiconductor device 100 further includes isolation structures such as shallow trench isolation (STI) features 126 formed in the substrate 124 to isolate one or more devices. The STI features 126 may include silicon oxide, silicon nitride, silicon oxynitride, fluoride-doped silicate (FSG), and/or a low-k dielectric material known in the art. Other isolation methods and/or features are possible in lieu of or in addition to STI. The STI features 126 may be formed by reactive ion etching (RIE) the substrate 124 to form trenches, which are then filled with an insulator material by a deposition process and leveled with a chemical-mechanical-polishing (CMP) process.

In each regions 102, 104, and 106, a conductive material overlays the semiconductor substrate 124. In one or more embodiments, the conductive material is a polysilicon layer 130. An oxide layer (e.g., a gate dielectric) may be disposed between the polysilicon layer 130 and the substrate 124. The polysilicon layer 130 is patterned into gate electrodes for the transistors 110 and 112 in the regions 102 and 104, respectively. Alternatively, the polysilicon layer 130 may be replaced with a multi-layer high-k metal gate (HKMG) stack, which may include a high-k dielectric, work function layer, capping layer, and conductive metal. Spacers, lightly doped drain (LDD) regions, and heavy doped source/drain regions may be formed adjacent the patterned gate electrodes in regions 102 and 104.

A self-aligned silicide layer 132 overlays the polysilicon layer 130 and the source and drain regions of the transistors 110 and 112. Further, an inter-level (or inter-layer) dielectric (ILD) layer 140 covers the aforementioned features in the regions 102, 104, and 106. The ILD layer 140 may be formed of silicon oxide or a low-k dielectric material. A plurality of contacts 142 extend through the ILD layer 140 and engage the silicide layer 132. Specifically, the contacts 142 engage the source/drain features in regions 102 and 104 and engage the STI features 126 in region 106. The contacts 142 may comprise tungsten or other suitable conductive material. In one or more embodiments, the contacts 142 have a circular-shaped cross-section, however, they may alternatively have any suitably-shaped cross-section such as a square or rectangular-shaped cross-section.

A first etch stop layer 143 overlays the ILD layer 140 and may be formed of silicon nitride, silicon oxynitride, and/or other suitable materials. A second etch stop layer 144 overlays the first etch stop layer 143. A further ILD layer 145 overlays the second etch stop layer 144. Contacts 146 extend through the ILD layer 145 and through the etch stop layers 144 and 143 and are electrically coupled to the contacts 142 in the ILD layer 140. Although each contact 142 is labeled separately from its associated contact 146, each pair may be considered one integrated contact. The contacts 146 may comprise tungsten or other suitable conductive material. In one or more embodiments, the contacts 146 have a circular-shaped cross-section, however, they may alternatively have any suitably-shaped cross-section such as a square or rectangular-shaped cross-section. A further etch stop layer 147 overlays the second ILD layer 145 and may be similar to etch stop layers 144 and 143. A third ILD layer 148 is disposed over the etch stop layer 147. The ILD layer 148 may be formed of a similar material to the ILD layers 144 and 140.

The MIM capacitors 114 in the region 104 include a bottom electrode 150, a top electrode 152, and an insulator 154 disposed between the top and bottom electrodes. In one or more embodiments, the electrodes 150 and 152 comprise titanium nitride (TiN). Alternatively, the electrodes 150 and 152 may optionally include tantalum nitride (TaN), tungsten nitride (WN), ruthenium (Ru), iridium (Ir), platinum (Pt), and combinations thereof. Additionally, the electrodes 150 and 152 may include a stack of two or more layers, such as a titanium nitride/titanium or titanium nitride/tungsten. Although not limited by the present disclosure, the electrodes 150 and 152 may have a thickness ranging from about 100 to about 500 angstrom (Å). The insulator 154 is a high-k dielectric material such as zirconium oxide ($ZrO_2$). Alternatively, the insulator 154 may optionally include one or more layers of silicon oxide ($SiO_2$), silicon nitride ($Si_3N_4$), silicon oxynitride (SiON), aluminum oxide ($Al_2O_3$), hafnium silicates (HfSiON), tantalum oxide ($Ta_2O_5$), hafnium oxide ($HfO_2$), titanium oxide ($TiO_2$), barium strontium titanate (BST), strontium titanate oxide (STO), or combinations thereof. The insulator 154 may have a thickness ranging between about 50 to about 400 Å, but may alternatively be thicker or thinner.

Figure 2:
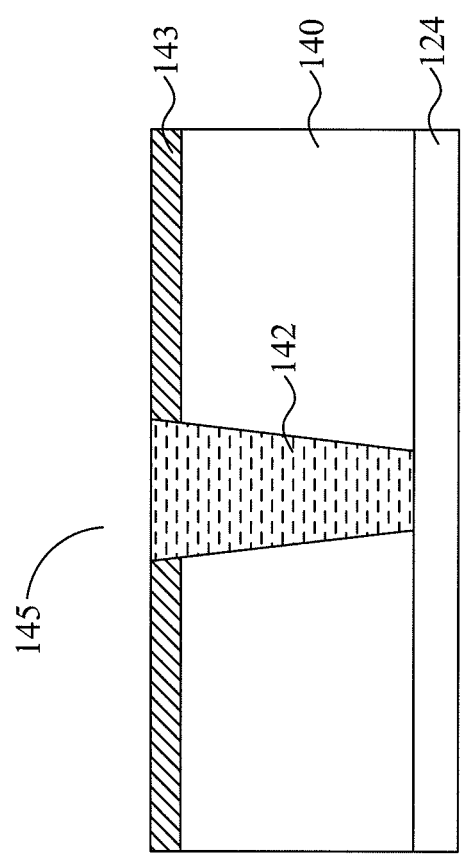
FIGS. 2-7 are diagrammatic sectional side views of a portion of the semiconductor device of FIG. 1 during various manufacturing stages.

The MIM capacitors 114 extend downwardly through the ILD layers 148 and 144 and etch stop layers 147, 143, and 144 such that the bottom electrodes 150 are respectively coupled to the doped features of the transistors 112 via the contacts 142. In one or more embodiments, when the bottom electrode 150 of the MIM capacitors 114 makes contact with the contact 142, the bottom electrode 150 goes completely through the second etch stop layer 144, but it does not go through the first etch stop layer 143. Therefore, as FIG. 2 shows, because the bottom electrode 150 does not go through the first etch stop layer 143, the bottom electrode 150 does not come in contact with the ILD layer 140. Additionally, the bottom electrode 150 also does not come into contact with the sidewalls of the contact 142.

Similarly, the MIM capacitor 120 in the region 106 includes a bottom electrode 160, a top electrode 162, and an insulator 164. The bottom electrode 160, top electrode 162, and insulator 164 may comprise the same materials as the bottom electrode 150, top electrode 152, and insulator 154, respectively. The capacitor 120 extends downwardly through the ILD layers 148 and 145 and etch stop layer 147, and it goes though the second etch stop layer 144, but terminates at the first etch stop layer 143, without going through the first etch stop layer 143. The bottom electrode 160 is thus electrically coupled to the OD region 125 via contact 142.

Although only one contact 142 is depicted in region 106, it is understood that a plurality of similar contacts may electrically couple the OD region 126 to the bottom electrode 160 of the capacitor 120.

The semiconductor device further includes an ILD layer 169 formed over the capacitors 114, 120 in the regions 104, 106, respectively, and over the ILD layer 148. The ILD layer 169 is of a similar composition to the ILD layer 148. In the regions 102 and 104, contacts 170 extend through the ILD layers 169 and 148 and engage the contacts 146. The contacts 170 may be of a similar composition to the contacts 146 and 142. A contact 171 extends through ILD layer 169 in region 106 and engages the top electrode 162 of the capacitor 120. The semiconductor device 100 further includes a first metal layer 172 of an interconnect structure. Contact 171 electrically couples the top electrode 162 of the capacitor 162 to the metal layer 172, and thus, to the interconnect structure. Contact groups 170, 146, and 142 electrically couple the source/drain features of the transistors 110 and 112 in regions 102 and 104, respectively, to the metal layer 172. The interconnect structure may include a plurality of metal layers for interconnecting the various devices and features in the regions 102, 104, 106. It is understood that the present disclosure does not limit the specific interconnection of the logic devices to each other or to a capacitor device or to the DRAM array. Those ordinarily skilled in the art will recognize that there are myriad applications, structures, device layouts and interconnection schemes in which a capacitor device in accordance with some embodiments of the present disclosure may be implemented. Accordingly, for the sake of simplicity and clarity, additional details of logic devices, DRAM arrays, and the interconnections between and among the various devices are not illustrated or further described herein.

With reference now to FIGS. 2-7, a method, in accordance with some embodiments, to manufacture the semiconductor device 100 of FIG. 1 is described. FIGS. 2-7 are diagrammatic sectional side views of a portion of the semiconductor device 100 during various manufacturing stages.

FIG. 2 depicts an early manufacturing stage in which the ILD layer 140 is formed on the semiconductor substrate 124. Thereafter, a first etch stop layer 143 is formed on the ILD layer 140. Then a photoresist layer is placed onto the first etch stop layer 143 and a lithographical process takes place to create an opening 145 through the first etch stop layer 143 and the ILD layer 140, but terminates at the semiconductor substrate 124. Then, contacts 142 are formed in the openings 145 in the ILD layer 140.

Figure 3:
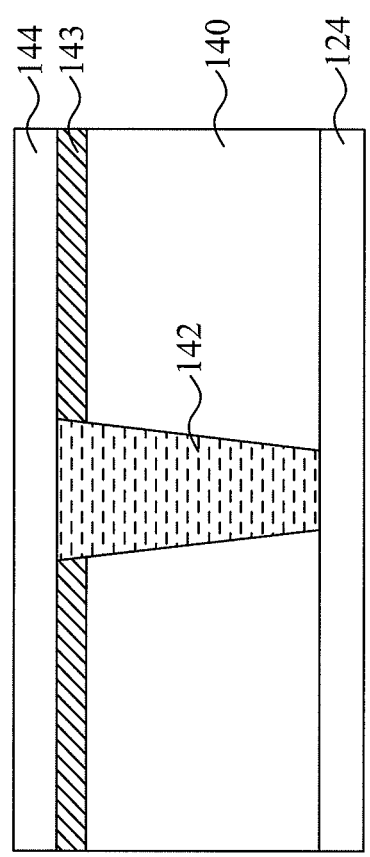

Then, as illustrated in FIG. 3, after the formation of the contacts 142 in the ILD layer 140, a second etch stop layer 144 is formed over the first etch stop layer 143 and the contact 142.

Figure 4:
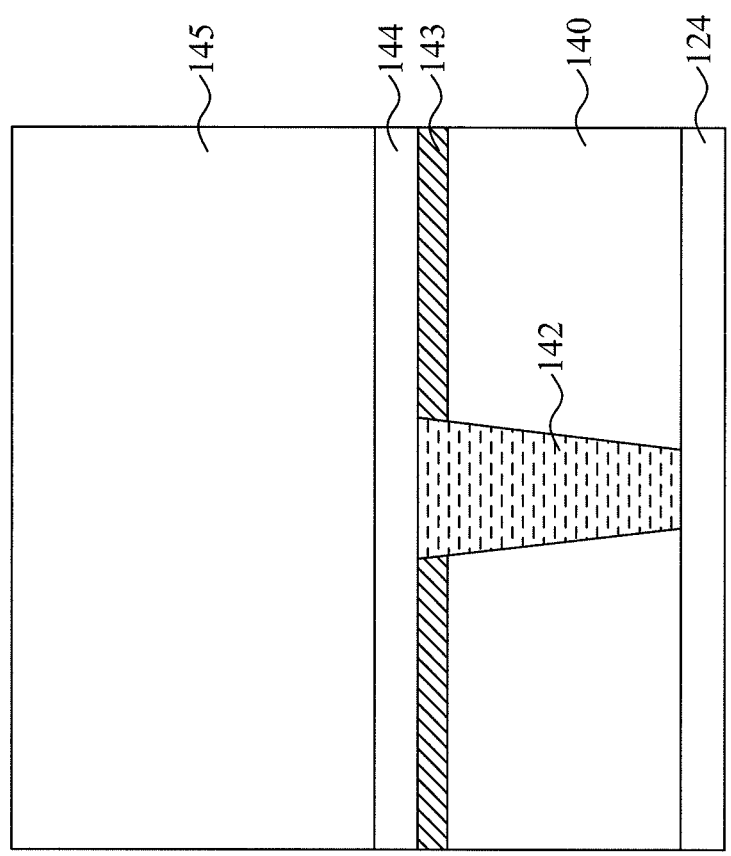
Figure 5:
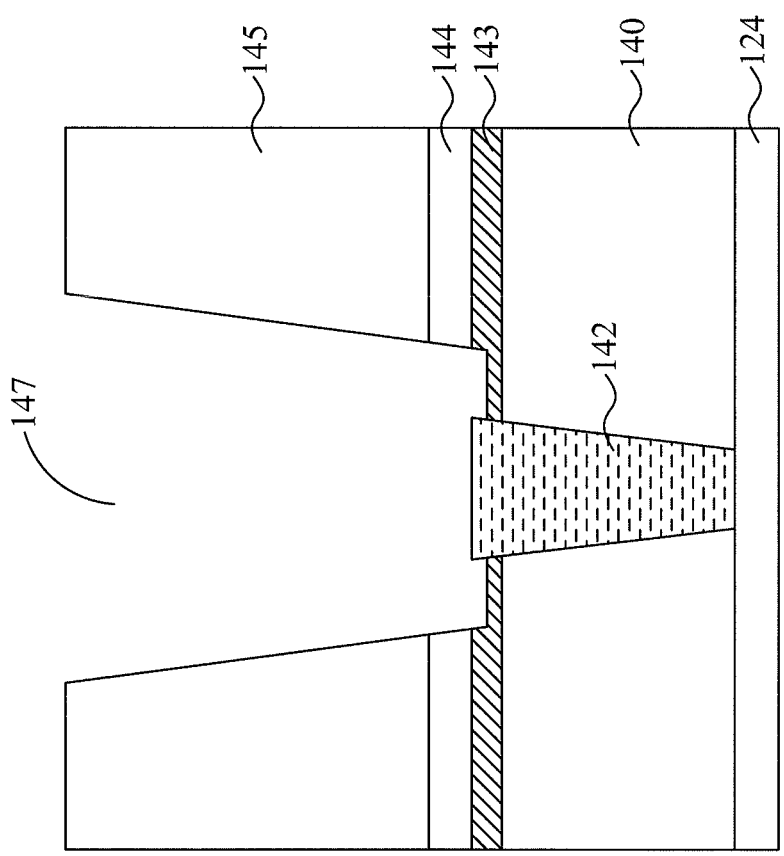

Referring to FIG. 4, a second ILD layer 145 is deposited over the second etch stop layer 144. The ILD layer 145 may be formed of silicon oxide or a low-k dielectric material by chemical vapor deposition (CVD), high density plasma CVD, spin-on, PVD (or sputtering), or other suitable methods. Next, openings 147 are formed in the second ILD layer 145, by using a photo lithographical process. Then, as FIG. 5 shows, a further etching step takes place to etch away the second etch stop layer 144 in the opening 147. This etching step also etches a portion of the first etch stop layer 143, to expose the contact 142. However, the etch step terminates before all of the first etch stop layer 143 is removed, so that the first ILD layer 140 is not exposed.

Figure 6:
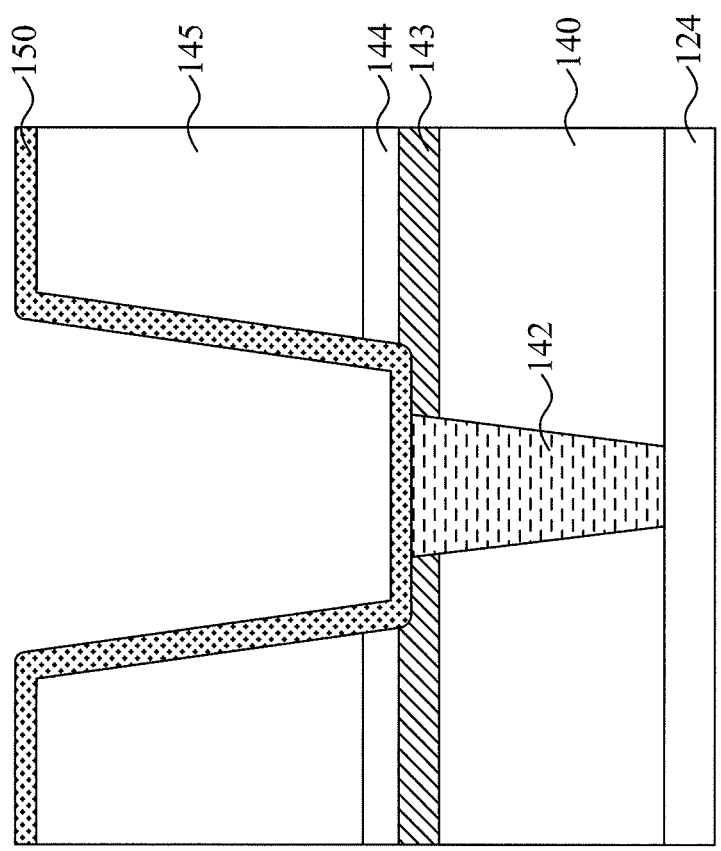

With reference to FIG. 6, the bottom electrode layers for the MIM capacitors 114 and 120 in the regions 104 and 106 are formed. Specifically, a metal layer is deposited to partially fill in the trenches 180 and 182. In trenches 180, the metal layer forms the bottom electrode layers 150 and engages the top faces of the contacts 142, and is thus electrically connected to the doped regions of the transistors 112. In the trench 182, the metal layer forms the bottom electrode layer 160 and is thus electrically connected to the OD region 125. Note that in one or more embodiments, due to the existence of the double etch top layers 143 and 144, the electrode layers 150 and 160 do not come in physical contact with the ILD layer 140. Rather, the electrode layers 150 and 160 cover up the exposed portions of the contact 142 and the first etch stop layer 143 in the openings 180 and 182. In one or more embodiments, the metal is a layer of TiN deposited to a thickness ranging from about 100 to about 500 Å, but in other embodiments may be thicker or thinner. It may be formed by atomic layer deposition (ALD), PVD, CVD, or other suitable technique. Subsequently, the portions of the metal layer outside the trenches 180 and 182 are removed by a suitable process such as chemical mechanical polishing (CMP).

Figure 7:
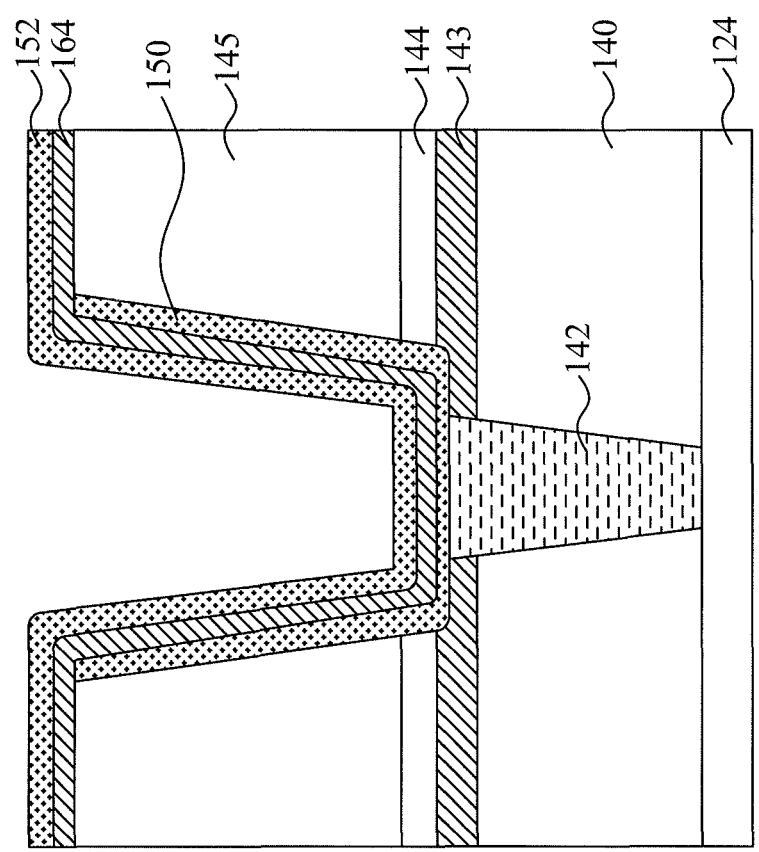

With reference to FIG. 7, the insulator and top electrode layers of the MIM capacitors 114 and 120 in the regions 104 and 106 are next formed. In the trenches 180, the dielectric layer forms the insulator 154 and in the trench 182, the dielectric layer forms the insulator 164. In one or more embodiments, the dielectric layer is a layer of $ZrO_2$ deposited to a thickness ranging from about 50 to about 400 Å, but in other embodiments may be thicker or thinner. It may be formed by ALD, PVD, CVD, or other suitable technique. Next, a second metal layer is deposited over the dielectric layer. In the trenches 180, the second metal layer forms the top electrodes 152 and in the trench 182, the second metal layer forms the top electrode 162. In one or more embodiments, the metal is a layer of TiN deposited to a thickness ranging from about 100 to about 500 Å, but in other embodiments may be thicker or thinner. It may be formed by ALD, PVD, CVD, or other suitable technique.

Now back to FIG. 1, the third ILD layer 169 is deposited over the MIM capacitors 114 and 120 in the regions 104 and 106. The ILD layer 169 fills in the remainder of the trenches 180 and 182. Next, the contact 170 is formed in the ILD layer 169. In particular, the contact 170 is formed by etching a trench in the ILD layer 169 and removing a portion of the etch stop layer 147, to expose a top portion of the contact 146. The trench is then filled with metal which engages the metal of the contact 142 in the region 104. Finally, the metal layer 172 is formed over the ILD layer 169 such that it engages the top face of contact 170 in region 104 and the top face of contact 171 in region 106. As mentioned above, the metal layer 172 is part of the interconnect structure for connecting the devices in region 104 and 106 to each other and to other devices the integrated circuit.

The semiconductor device 100 is not limited to the embodiments and structure of the integrated circuit described above. The MIM capacitors 120 and 200 may be in parallel or in series with the DRAM circuit in region 104 and also may be in parallel or in series with the logic circuit in region 102. Further, the integrated circuits in the semiconductor devices 100 and 198 can also include passive components such as resistors, capacitors, inductors, and/or fuses; and active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

Furthermore, the processes described with respect to FIGS. 2-7 are not limited to the described details.

An aspect of this description relates to a method of fabricating a semiconductor device. The method comprises forming a first etch stop layer over a first dielectric layer. The method also comprises forming a first trench in the first etch stop layer and the first dielectric layer by removing a portion of the first etch stop layer and by removing a portion of the first dielectric layer. The method further comprises filling the first trench with a conductive material. The method additionally comprises forming a second etch stop layer over the first etch stop layer. The method also comprises forming a second dielectric layer over the second etch stop layer. The method further comprises forming a second trench to expose the conductive material by removing a portion of the second dielectric layer, a portion of the second etch stop layer, and a portion of the first etch stop layer. The second trench is formed having a depth less than a total thickness of the first etch stop layer, the second etch stop layer and the second dielectric layer. The method additionally comprises depositing a first metal layer over sidewalls of the second trench and in contact with the conductive material.

Another aspect of this description relates to method of fabricating a semiconductor device. The method comprises forming a contact plug within a first dielectric layer. The method also comprises forming an etch stop layer over the first dielectric layer. The method further comprises forming a second dielectric layer over the etch stop layer, the second dielectric layer being formed having a contact opening over the contact plug. The contact opening further extends into a partial thickness of the etch stop layer. The method additionally comprises depositing a metal layer in the contact opening, the metal layer engaging the contact plug and being free of direct contact with the first dielectric layer.

A further aspect of this description relates to a method of fabricating a semiconductor device. The method comprises forming a first etch stop layer over a first dielectric layer having a conductive plug therein. The method also comprises forming a second etch stop layer over the first etch stop layer. The method further comprises forming a second dielectric layer over the second etch stop layer. The method additionally comprises removing a portion of the second dielectric layer, a portion of the second etch stop layer, and a portion of the first etch stop layer to expose the conductive plug. The method also comprises depositing a conductive material over and in direct contact with the conductive plug. In the method, less than an entire thickness of the first etch stop layer is removed to expose the conductive plug.

The foregoing outlines features of several embodiments so that those ordinarily skilled in the art may better understand various aspects of the present disclosure. Those ordinarily skilled in the art should appreciate that they may readily use the present disclosure as a basis for designing or modifying other processes and structures for carrying out the same or similar purposes and/or achieving the same or similar advantages disclosed herein. Those ordinarily skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a first etch stop layer over a first dielectric layer;
   forming a first trench in the first etch stop layer and the first dielectric layer by removing a portion of the first etch stop layer and by removing a portion of the first dielectric layer;
   filling the first trench with a conductive material;
   forming a second etch stop layer over the first etch stop layer;
   forming a second dielectric layer over the second etch stop layer;
   forming a second trench to expose the conductive material by removing a portion of the second dielectric layer, a portion of the second etch stop layer, and a portion of the first etch stop layer, wherein the second trench is formed having a depth less than a total thickness of the first etch stop layer, the second etch stop layer and the second dielectric layer; and
   depositing a first metal layer over sidewalls of the second trench and in contact with the conductive material.

2. The method of claim 1, wherein the second trench is formed without exposing the first dielectric layer.

3. The method of claim 1, wherein the first metal layer is deposited such that the metal layer covers an entire inner surface of the second trench, including the sidewalls of the second trench.

4. The method of claim 1, wherein the first metal layer is deposited in direct contact with the first etch stop layer in the second trench.

5. The method of claim 1, wherein the first metal layer is deposited having a thickness ranging from about 100 to about 500 Å.

6. The method of claim 1, further comprising:
   depositing a third dielectric layer over the first metal layer in the second trench; and
   depositing a second metal layer over the third dielectric layer in the second trench.

7. A method of fabricating a semiconductor device, the method comprising:
   forming a contact plug within a first dielectric layer;
   forming an etch stop layer over the first dielectric layer;
   forming a second dielectric layer over the etch stop layer, the second dielectric layer being formed having a contact opening over the contact plug, wherein the contact opening further extends into a partial thickness of the etch stop layer; and
   depositing a metal layer in the contact opening, the metal layer engaging the contact plug and being free of direct contact with the first dielectric layer.

8. The method of claim 7, wherein the metal layer is deposited such that the metal layer covers an entire inner surface of the contact opening.

9. The method of claim 7, wherein the metal layer is deposited in direct contact with the etch stop layer in the contact opening.

10. The method of claim 7, wherein depositing the metal layer comprises depositing TiN onto sidewalls and a bottom surface of the contact opening.

11. The method of claim 7, further comprising:
    depositing a third dielectric material over the metal layer within the contact opening,
    wherein depositing the third dielectric material comprises depositing $ZrO_2$ to a thickness ranging from about 50 to about 400 Å.

12. The method of claim 7, wherein the contact plug comprises a sidewall extending downward from an upper portion to a lower portion of the contact plug, and the metal layer is deposited such that the sidewall of the contact plug is free of direct contact with the metal layer.

13. The method of claim 7, wherein the etch stop layer is a first etch stop layer, and the method further comprises:
    forming a second etch stop layer over the second dielectric layer; and
    forming a third dielectric layer over the second etch stop layer;
    wherein second etch stop layer and the third dielectric layer are formed such that the contact opening further extends through the third dielectric layer and the second etch stop layer.

14. A method of fabricating a semiconductor device, the method comprising:
    forming a first etch stop layer over a first dielectric layer having a conductive plug therein;
    forming a second etch stop layer over the first etch stop layer;
    forming a second dielectric layer over the second etch stop layer; and
    removing a portion of the second dielectric layer, a portion of the second etch stop layer, and a portion of the first etch stop layer to expose the conductive plug; and
    depositing a conductive material over and in direct contact with the conductive plug;
    wherein less than an entire thickness of the first etch stop layer is removed to expose the conductive plug.

15. The method of claim 14, wherein the conductive plug is exposed without exposing the first dielectric layer.

16. The method of claim 14, wherein the conductive material is deposited to cover portions of the second etch stop layer and the second dielectric layer.

17. The method of claim 14, wherein the conductive material is deposited in contact with the first etch stop layer.

18. The method of claim 14, further comprising:
    forming a third dielectric layer in physical contact with the conductive material
    wherein the third dielectric layer is formed such that the conductive material is between the third dielectric layer and the conductive plug.

19. The method of claim 18, further comprising:
    depositing a metal layer in direct physical contact with the third dielectric layer,
    wherein the metal layer is formed such that the third dielectric layer is between the metal layer and the conductive material.

20. The method of claim 19, wherein depositing the metal layer comprises depositing TiN onto the third dielectric layer.

* * * * *